(12) United States Patent
Tsuzuki et al.

(10) Patent No.: US 7,728,382 B2
(45) Date of Patent: Jun. 1, 2010

(54) SEMICONDUCTOR DEVICE HAVING DIODE AND IGBT

(75) Inventors: Yukio Tsuzuki, Nukata-gun (JP); Kenji Kouno, Gifu (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 12/222,557

(22) Filed: Aug. 12, 2008

(65) Prior Publication Data
US 2009/0072339 A1      Mar. 19, 2009

(30) Foreign Application Priority Data
Sep. 18, 2007    (JP) ............................... 2007-240595

(51) Int. Cl.
*H01L 29/76* (2006.01)
(52) U.S. Cl. ................ 257/341; 257/476; 257/E29.197
(58) Field of Classification Search ................. 257/341, 257/476, E29.197
See application file for complete search history.

(56) References Cited

U.S. PATENT DOCUMENTS

| | | |
|---|---|---|
| 5,969,400 A | 10/1999 | Shinohe et al. |
| 6,707,128 B2 * | 3/2004 | Moriguchi et al. .......... 257/484 |
| 7,572,683 B2 * | 8/2009 | Takei et al. ................. 438/140 |
| 2007/0108468 A1 | 5/2007 | Takahashi |
| 2007/0200138 A1 | 8/2007 | Ozeki et al. |

FOREIGN PATENT DOCUMENTS

JP      A-6-196705      7/1994

* cited by examiner

*Primary Examiner*—Mark Prenty
(74) *Attorney, Agent, or Firm*—Posz Law Group, PLC

(57) ABSTRACT

A semiconductor device includes: a semiconductor substrate including a first conductive type layer; a plurality of IGBT regions, each of which provides an IGBT element; and a plurality of diode regions, each of which provides a diode element. The plurality of IGBT regions and the plurality of diode regions are alternately arranged in the substrate. Each diode region includes a Schottky contact region having a second conductive type. The Schottky contact region is configured to retrieve a minority carrier from the first conductive type layer. The Schottky contact region is disposed in a first surface portion of the first conductive type layer, and adjacent to the IGBT region.

12 Claims, 8 Drawing Sheets

US 7,728,382 B2

SEMICONDUCTOR DEVICE HAVING DIODE AND IGBT

CROSS REFERENCE TO RELATED APPLICATION

This application is based on Japanese Patent Application No. 2007-240595 filed on Sep. 18, 2007, the disclosure of which is incorporated herein by reference.

FIELD OF THE INVENTION

The present invention relates to a semiconductor device having a diode and an IGBT.

BACKGROUND OF THE INVENTION

A semiconductor device having a diode and an IGBT is disclosed in, for example, US Patent Application Publication No. 2007/0108468.

In the device, an N type layer and a P type base layer are formed on an N-type substrate. A pair of grooves is formed on a surface of the base layer such that the grooves reach the substrate. An N type emitter region is formed in the base layer such that the emitter region is sandwiched between the grooves.

A gate oxide film is formed on an inner wall of the groove, and a gate electrode is formed in the groove through the gate oxide film. Thus, the base layer contacts the gate electrode via the gate oxide film. The base layer provides a channel region of the IGBT. An interlayer insulation film is formed over the gate electrode such that the interlayer insulation film covers a part of the emitter region.

An emitter electrode is formed on a part of the emitter region and the base layer. The emitter electrode also provides an anode electrode of the diode. A P+ type collector layer and an N+ type cathode layer are formed independently on a back side of the substrate. A collector electrode coupled with both of the collector layer and the cathode layer is formed on the substrate. The collector electrode also provides a cathode electrode of the diode.

The diode and the IGBT are integrated in the substrate. The IGBT region having the collector disposed on the back side of the substrate functions as the IGBT. The diode region having the cathode layer disposed on the back side of the substrate functions as the diode. Multiple diodes and IGBTs may be formed in the substrate so that an inverter is provided.

However, the inventors realize the following difficulty.

When a forward bias of the diode is applied between the emitter electrode and the collector electrode, electrons is supplied from the cathode layer to the substrate. Further, holes are supplied from the base layer to the substrate. Then, the electrons in the substrate are dominant, i.e., excess, so that the electrons flow from the cathode (i.e., the collector electrode) to the anode (i.e., the emitter electrode). Thus, the diode flows the forward current therethrough.

In this case, when a reverse voltage is rapidly applied between the emitter electrode and the collector electrode, the reverse current flows for a short moment. Specifically, the holes supplied from the base layer to the substrate moves toward a direction opposite to the forward direction so that the holes moves to the emitter electrode side. Further, the holes remained in the substrate recombine with the electrons, and/ or the holes in the substrate are diffused, so that the reverse current flows, i.e., reverse recovery occurs. Accordingly, the holes accumulated in the substrate flows into the anode (i.e., the emitter electrode) via the base layer at the recovery process.

When the IGBT turns on, since the resistance of the channel region in the IGBT is very small, the emitter electrode and the substrate short-circuit. That is, at the diode recovery operation, when the IGBT turns on, the diode short-circuits, and the current flows from the diode region to the IGBT region.

Accordingly, in a conventional semiconductor device, at the diode recovery operation, the current easily concentrates at the boundary between the diode region and the IGBT region, so that breakdown of the device may occur.

Thus, it is required for a semiconductor device having a diode and an IGBT to prevent current concentration at a boundary between the IGBT and the diode in case of diode recovery process.

SUMMARY OF THE INVENTION

In view of the above-described problem, it is an object of the present disclosure to provide a semiconductor device having a diode and an IGBT.

According to a first aspect of the resent disclosure, a semiconductor device includes: a semiconductor substrate including a first conductive type layer; a plurality of IGBT regions, each of which provides an IGBT element; and a plurality of diode regions, each of which provides a diode element. The plurality of IGBT regions and the plurality of diode regions are alternately arranged in the substrate. Each diode region includes a Schottky contact region having a second conductive type. The Schottky contact region is configured to retrieve a minority carrier from the first conductive type layer. The Schottky contact region is disposed in a first surface portion of the first conductive type layer, and adjacent to the IGBT region.

In the above device, since the Schottky contact region is disposed at the boundary between the IGBT region and the diode region, the Schottky contact region retrieves the minority carrier from the first conductive type layer. Thus, the minority carrier at the boundary is reduced, so that a recovery current is prevented from flowing from the diode region to the IGBT region even when the IGBT element turns on in case of recovery process. Accordingly, the current concentration at the boundary in case of diode recovery operation is reduced. Thus, the device is protected from breakdown.

According to a second aspect of the present disclosure, a semiconductor device includes: a semiconductor substrate including a silicon substrate and a first conductive type layer, wherein the first conductive type layer is disposed on the silicon substrate; a plurality of IGBT regions, each of which provides an IGBT element; and a plurality of diode regions, each of which provides a diode element. The plurality of IGBT regions and the plurality of diode regions are alternately arranged in the semiconductor substrate. Each diode region includes a Schottky contact region having a second conductive type. The Schottky contact region is configured to retrieve a minority carrier from the first conductive type layer. The Schottky contact region is disposed in a first surface portion of the first conductive type layer, and adjacent to the IGBT region. Each diode region further includes a second conductive type region and an ohmic contact region having the second conductive type. The second conductive type region is disposed in a third surface portion of the first conductive type layer. The second conductive type region is disposed on an inside of the diode region from the Schottky contact region. The ohmic contact region is disposed in a fourth surface portion of the second conductive type region. The ohmic contact region has an impurity concentration higher than the second conductive type region. Each diode region further includes a trench, which surrounds the second conductive type region and the Schottky contact region, and the trench has a rectangular shape, penetrates the second conductive type region and the Schottky contact region, and reaches the first conductive type layer.

In the above device, since the Schottky contact region is disposed at the boundary between the IGBT region and the diode region, the Schottky contact region retrieves the minority carrier from the first conductive type layer. Thus, the minority carrier at the boundary is reduced, so that a recovery current is prevented from flowing from the diode region to the IGBT region even when the IGBT element turns on in case of recovery process. Accordingly, the current concentration at the boundary in case of diode recovery operation is reduced. Thus, the device is protected from breakdown.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENTS

First Embodiment

In following embodiments, for example, a first conductive type corresponds to an N conductive type, and a second conductive type corresponds to a P conductive type. Alternatively, the first conductive type may correspond to the P conductive type, and the second conductive type may correspond to the N conductive type.

Figure 1:
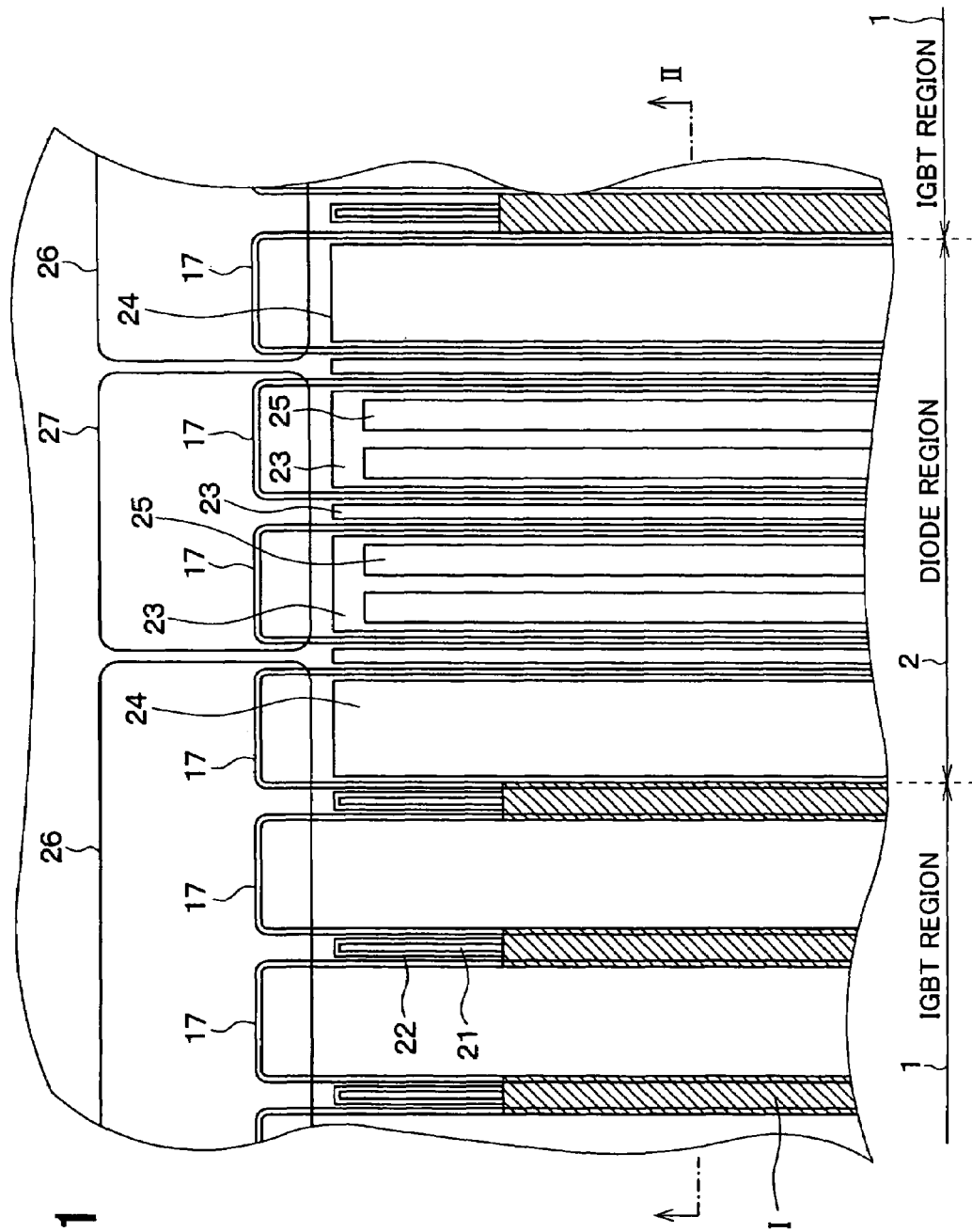
FIG. 1 is a plan view showing a semiconductor device according to a first embodiment.

FIG. 1 shows a semiconductor device having an IGBT and a diode according to a first embodiment. The device is suitably used for an inverter.

The device includes an IGBT region 1 functioning as an IGBT and a diode region 2 functioning as a diode. Multiple IGBT regions 1 and multiple diode regions 2 are alternately arranged along with a repeat direction.

The IGBT region 1 and the diode region 2 are formed in a surface portion of an N− conductive type drift layer 11, which is disposed on an N conductive type silicon substrate 10. A P+ conductive type region 12 corresponding to the IGBT region 1 is formed on a back side of the substrate 10. An N+ conductive type region 13 corresponding to the diode region 2 is formed on the back side of the substrate 10. In this embodiment, the P+ conductive type region 12 and the N+ conductive type region 13 are collector-grounded.

In the IGBT region 1, a P conductive base region 14 for providing a channel region is formed in a surface portion of the drift layer 11. A P+ conductive type body region 15 is formed in a surface portion of the base region 14. An N+ conductive type source region 16 is formed in a surface portion of the body region 15. Here, the P conductive type base region 14 corresponds to a second conductive type layer.

Here, the N conductive type silicon substrate 10 and the N− conductive type drift layer 11 define a semiconductor substrate.

Figure 2:
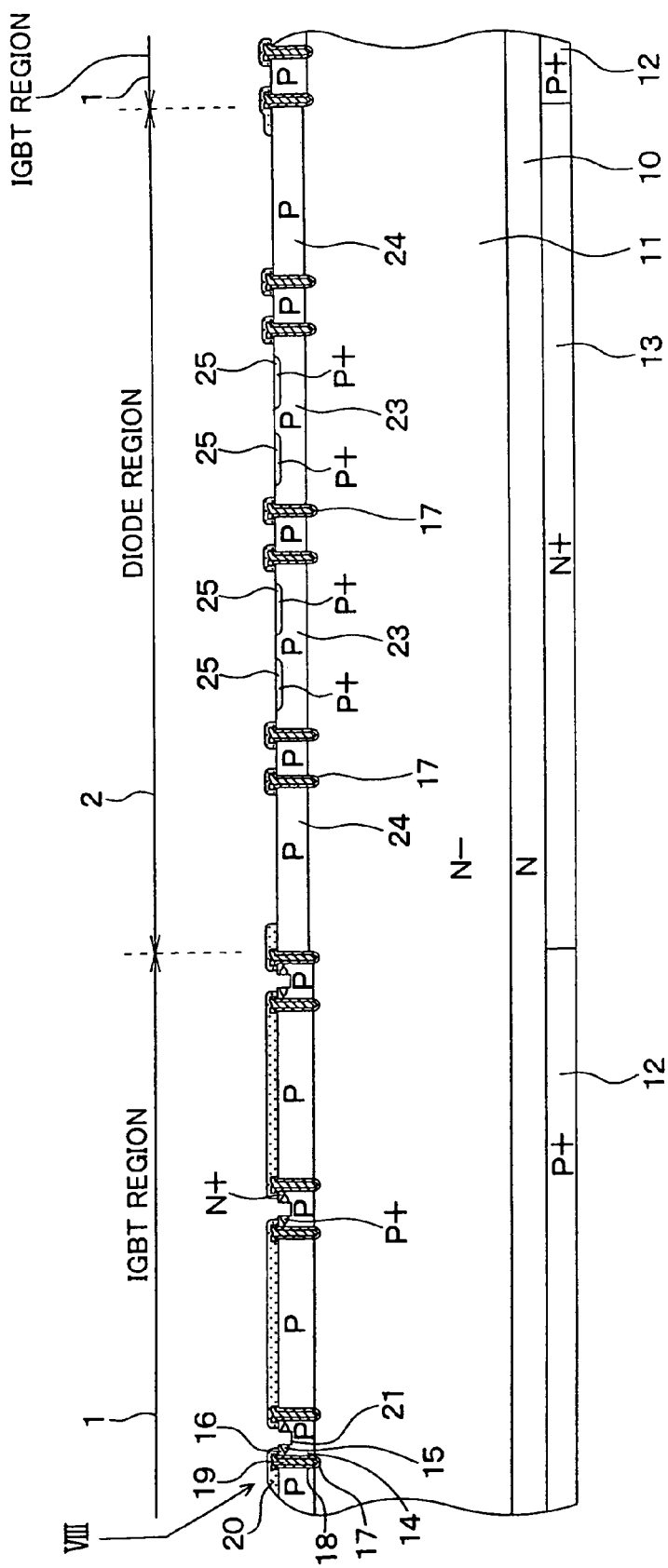
FIG. 2 is a cross sectional view showing the device taken along line II-II in FIG. 1.
Figure 8:
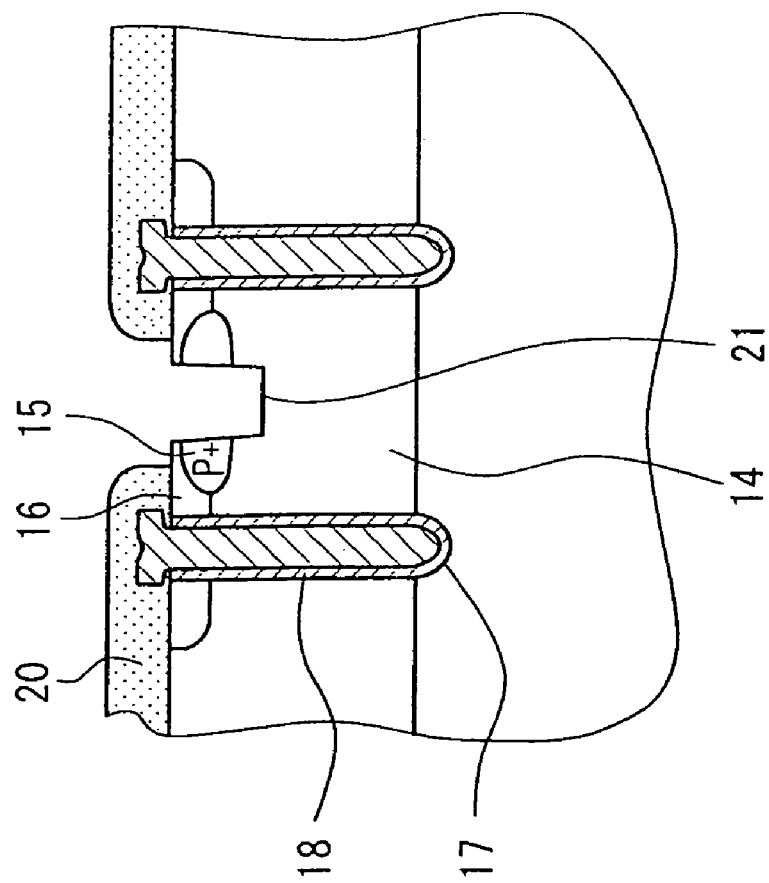
FIG. 8 is a partially enlarged cross sectional view showing a part VIII of the device in FIG. 2.

As shown in FIGS. 2 and 8, a trench 17 is formed in the semiconductor substrate in such a manner that the trench 17 reaches the drift layer 11 through the source region 16, the body region 15 and the base region 14. A gate insulation film 18 made of $SiO_2$ is formed on an inner wall of the trench 17, and further, a gate electrode 19 made of poly silicon is also formed in the trench 17 via the gate insulation film 18. The trench 17, the gate insulation film 18 and the gate electrode 19 provide a trench gate structure. An interlayer insulation film 20 made of, for example, BPSG is formed on the source region 16 and the gate electrode 19.

A groove 21 having a depth shallower than the trench 17 is formed between two adjacent trenches 17. The groove 21 penetrates the source region 16 and the body region 15, and reaches the base region 14. The base region 14, the body region 15, the source region 16, the trench gate structure, and the groove 21 define a device region. In FIG. 1, the device region is shown as a hatched region I.

The trench 17 has a rectangular shape, and surrounds the base region 14. Further, multiple trenches 17 are aligned along with the repeat direction of the IGBT regions 1 and the diode regions 2.

The device region is formed between two adjacent trenches 17. The device region extends along with a direction perpendicular to the repeat direction of the IGBT regions 1 and the diode regions 2. The groove 21 and a contact portion 22 are disposed outside of the device region, and extend along with the repeat direction. The contact portion 22 is a contact region formed in a surface portion of the base region 14. A metal electrode (not shown) is formed over the contact portion 22 so that the metal electrode and the semiconductor substrate are electrically coupled with each other.

In the diode region 2, multiple trench gate structures similar to the trench gate structure in the IGBT region 1 are formed in a surface portion of the semiconductor substrate. Specifically, a P conductive type region 23 is formed in a surface portion of the semiconductor substrate. Multiple trenches 17 are formed in the substrate ion such a manner that the trench 17 penetrates the P conductive type region 23 and reaches the drift layer 11. The trench 17 in the diode region 2 has a rectangular shape similar to the trench 17 in the IGBT region 1.

In the diode region 2, a Schottky contact region 24 having a P conductive type is formed in a surface portion of the drift layer 11, which is disposed on an utmost IGBT region side of the diode region 2, i.e., the surface portion of the drift layer 11 is disposed closer to the IGBT region 1. The Schottky contact region 24 retrieves a minority carrier, i.e., a hole from the drift layer 11. The Schottky contact region 24 is surrounded with the trench 17. The impurity concentration of the Schottky contact region 24 is, for example, between $1 \times 10^{16}$ cm$^{-3}$ and $1 \times 10^{17}$ cm$^{-3}$.

The Schottky contact region 24 is disposed in a part of the P conductive type region 23, which is disposed on an utmost IGBT region side.

Further, in the diode region 2, an ohmic contact region 25 having a P+ conductive type is formed in a part of the diode region 2, which is disposed inside of the Schottky contact region 24. The impurity concentration of the ohmic contact region 25 is higher than the P conductive type region 23. The ohmic contact region 25 is formed in a surface portion of the P conductive type region 23. The ohmic contact region 25 is surrounded with the trench 17. The ohmic contact region 25 functions as a hole supply source for supplying the holes to the drift layer 11.

The ohmic contact region 25 extends along with a direction perpendicular to the repeat direction of the IGBT region 1 and the diode region 2. The ohmic contact region 25 aligns in a linear manner. Thus, in the diode region 2, the holes are introduced to the drift layer 11 homogeneously by using the ohmic contact region 25. The impurity concentration of the ohmic contact region 25 is, for example, $1 \times 10^{19}$ cm$^{-3}$.

In the diode region 2, the ohmic contact region 25 is formed in a region surrounded with the trench 17. A PIN diode is formed by the N− conductive type drift layer 11, the P conductive type region 23 and the ohmic contact region 25. The PIN diode is disposed in the region in which the ohmic contact region 25 is formed. A part of the surface portion of the P conductive type region 23, the part in which the ohmic contact region 25 is not formed, functions as a Schottky diode. Thus, the PIN diode in the high impurity concentration P conductive type portion and the Schottky diode in the low impurity concentration P conductive type portion are formed in the region surrounded with the trench 17.

In the diode region 2, the P conductive type region 23 in which the ohmic contact region 25 are formed, and the Schottky contact region 24 extend along with the direction perpendicular to the repeat direction so that the P conductive type region 23 and the Schottky contact region 24 are formed from one end to the other end in the diode region 2, the ends corresponding to the contact region 22 of the IGBT region 1.

An emitter electrode (not shown) is formed on the semiconductor substrate. The emitter electrode is also formed in the groove 21 of the IGBT region 1. Thus, the emitter electrode directly contacts the base region 14, so that a distance between the channel region and the emitter contact portion becomes short. Thus, the resistance between the trench 17 and the groove becomes small. Further, the hole injection at the PN junction is reduced, so that recovery withstand is improved.

As shown in FIG. 1, a gate pad 26 and an emitter pad 27 are disposed in the substrate. The gate pad is electrically coupled with the IGBT region 1 and, the emitter pad 27 is electrically coupled with the diode region 2. Specifically, the gate pad 26 is electrically connected to the gate structure in the trench 17 in the IGBT region 1. Further, the gate pad 26 is electrically connected to the gate structure in the trench 17 of the diode region 2 for surrounding the Schottky contact region 24. The emitter pad 27 is electrically coupled with the gate structure of the trench 17 for surrounding the P conductive type region 23, in which the ohmic contact region 25 is formed.

The gate structure in the trench 17 surrounding the ohmic contact region 25 in the diode region 2 is electrically isolated from the gate pad 26. Thus, the PIN diode and the Schottky diode do not depend on a gate voltage. Thus, the forward voltage Vf of the diode becomes small.

The operation of the semiconductor device will be explained. Firstly, in a normal operation, the IGBT turns on when a driving signal is input to the gate. Thus, a current flows between the emitter and the collector.

The diode commutates a load current flowing through the IGBT. When the diode operates in the forward direction, only the current provided by the electrons, i.e., the electron current flows in a part of the diode region 2, in which the Schottky contact region 24 is formed. Thus, the hole is not introduced into the drift layer 11. Further, the holes are introduced from the ouhmic contact region 25 to the drift layer 11 in another part of the diode region 2, in which the ohmic contact region 25 is formed. Accordingly, when the diode operates in the forward direction, the diode functions at the other part of the region, in which the ohmic contact region 25 is formed, i.e., which is far from the IGBT region 1. Thus, by supplying the holes from the ohmic contact region 25, the forward voltage Vf of the diode becomes small. Further, the forward direction property of the diode is improved.

When the diode operates in a recovery process, the hole current, i.e., the current provided by the holes flows in the region of the diode region 2, in which the Schottky contact region 24 is formed. Thus, the Schottky contact region 24 retrieves the holes from the drift layer 11. The Schottky contact region 24 is disposed on the part of the diode region 2, which is disposed on the utmost IGBT region side. Thus, the Schottky contact region 24 retrieves the holes from the boundary between the IGBT region 1 and the diode region 2.

Accordingly, even when the IGBT turns on at the diode recovery process, the recovery current flowing from the diode region 2 to the IGBT region 1 is reduced. Thus, the current concentration at the boundary between the IGBT region 1 and the diode region 2 is prevented. Specifically, the current does not concentrate at the boundary. Thus, the withstand property (i.e., breakdown resistance) of the semiconductor device is improved.

A part of the diode region 2, in which the ohmic contact region 25 is surrounded with the trench 17, is separated from other part of the diode region 2 by the trench 17. Thus, the hole current is prevented from penetrating into the part of the diode region 2 from the other part of the diode region 2 when the diode operates in the recovery process. Thus, the breakdown caused by the current concentration of the hole current is prevented.

In this embodiment, the Schottky contact region 24 for retrieving the holes from the drift layer 11 at the diode recovery process is formed in the part of the diode region 2, which is disposed on the utmost IGBT region side.

Thus, the holes at the boundary between the IGBT region 1 and the diode region 2 are reduced, so that the recovery current caused by the hole recombination and hole diffusion is prevented from concentrating from the diode region 2 to the IGBT region 1. Accordingly, the current is prevented from concentrating at the boundary in case of the diode recovery operation. Further, the breakdown of the device is prevented.

In this case, the trench 17 surrounds the Schottky contact region 24. Thus, even when the electric field concentrates at the trench 17 disposed on a periphery of the IGBT region 1 because the IGBT region 1 has the trench gate structure, the electric field strength between the IGBT region 1 and the diode region 2 is homogenized, so that the breakdown of the semiconductor device is improved.

Second Embodiment

Figure 3:
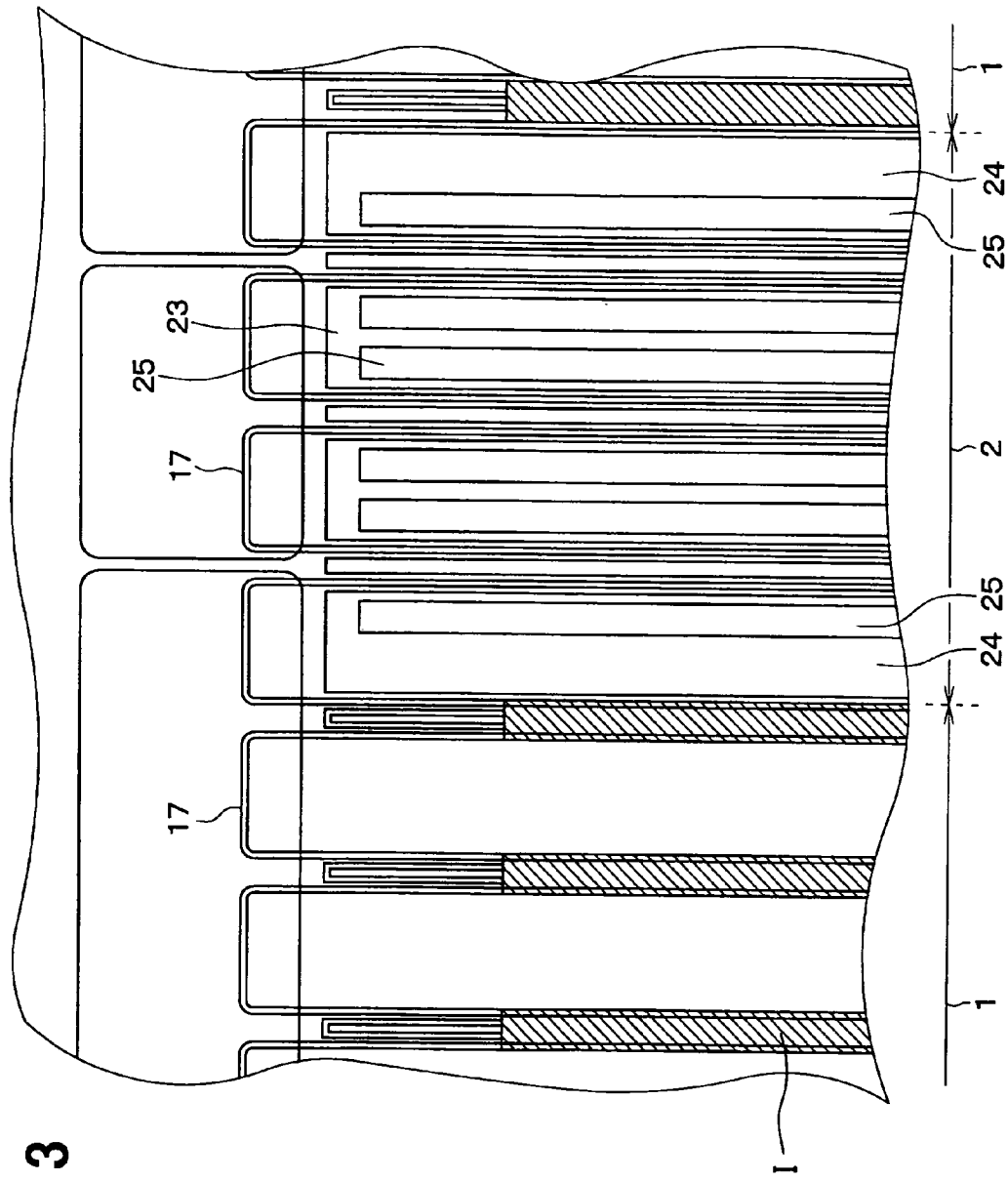
FIG. 3 is a plan view showing a semiconductor device according to a second embodiment.

FIG. 3 shows a semiconductor device according to a second embodiment. The ohmic contact region 25 is also formed in the Schottky contact region 24. In this case, the ohmic contact region 25 is disposed in a surface portion of the Schottky contact region 24 and inside of the diode region 2. The ohmic contact region 25 is formed in a linear manner.

Since the ohmic contact region 25 is formed in the Schottky contact region 24, the hole injection to the drift layer 11 increases, so that the forward voltage Vf of the diode is much reduced.

Third Embodiment

Figure 4:
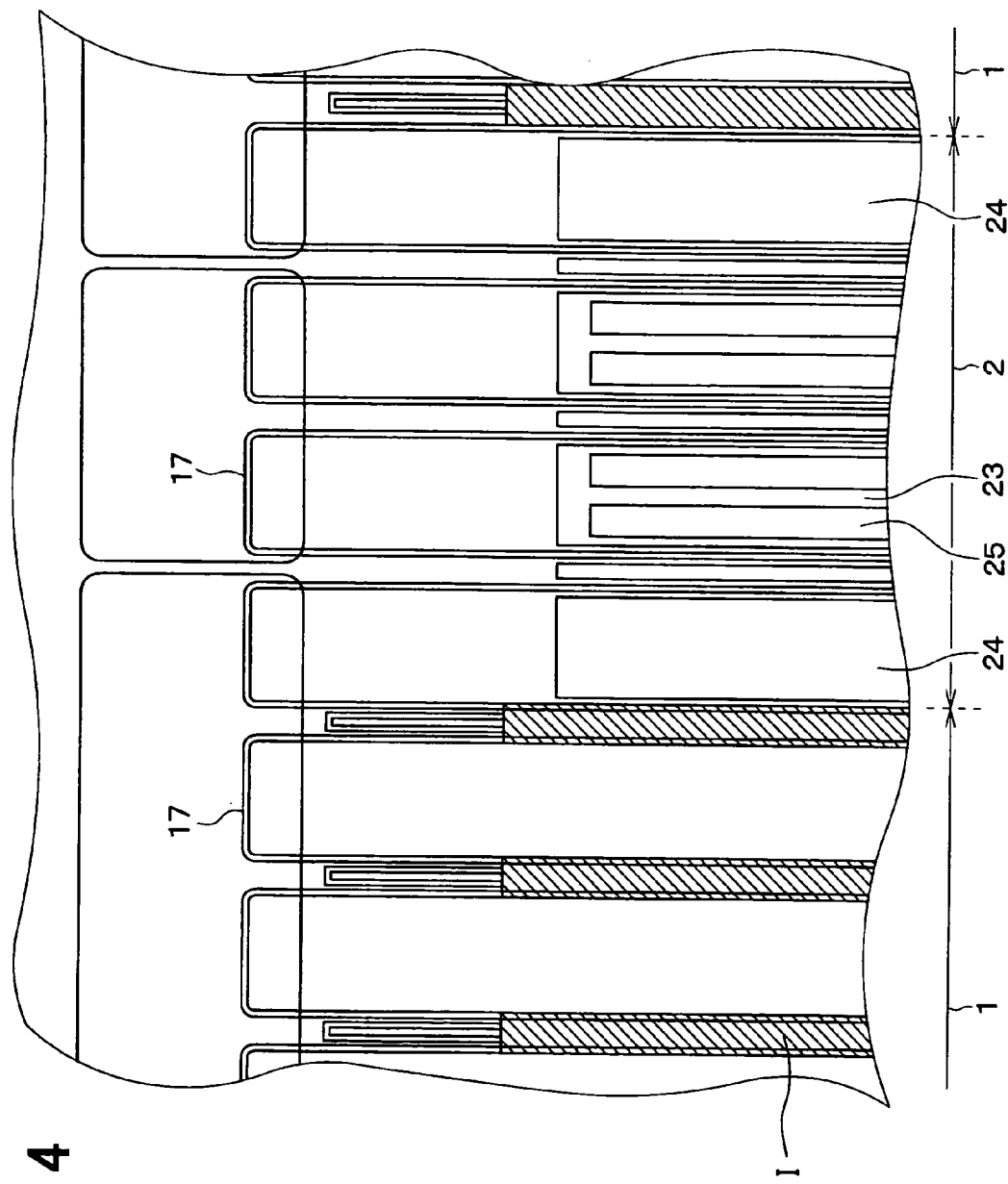
FIG. 4 is a plan view showing a semiconductor device according to a third embodiment.

FIG. 4 shows a semiconductor device according to a fourth embodiment. In the diode region 2, the Schottky contact region 24 and the P conductive type region 23 reach the one end of the device region of the IGBT region 1. The one end of the device region is disposed on the periphery along with the direction perpendicular to the repeat direction of the IGBT region 1 and the diode region 2. Specifically, in the diode region 2, the Schottky contact region 24 and the P conductive type region 23 are not formed in the region sandwiched by the contact portion 22 in the IGBT region 1.

In this case, at the diode recovery operation, there is no hole injection region near the contact portion 22. Thus, the current does not concentrate at the contact portion from a periphery region and the diode region 2. Accordingly, the current concentration at a terminal portion of the IGBT region 1, i.e., at the contact portion 22 is reduced. Here, the current may easily concentrate at the terminal portion, i.e., the contact portion 22. Thus, the recovery-breakdown property is improved.

Fourth Embodiment

Figure 5:
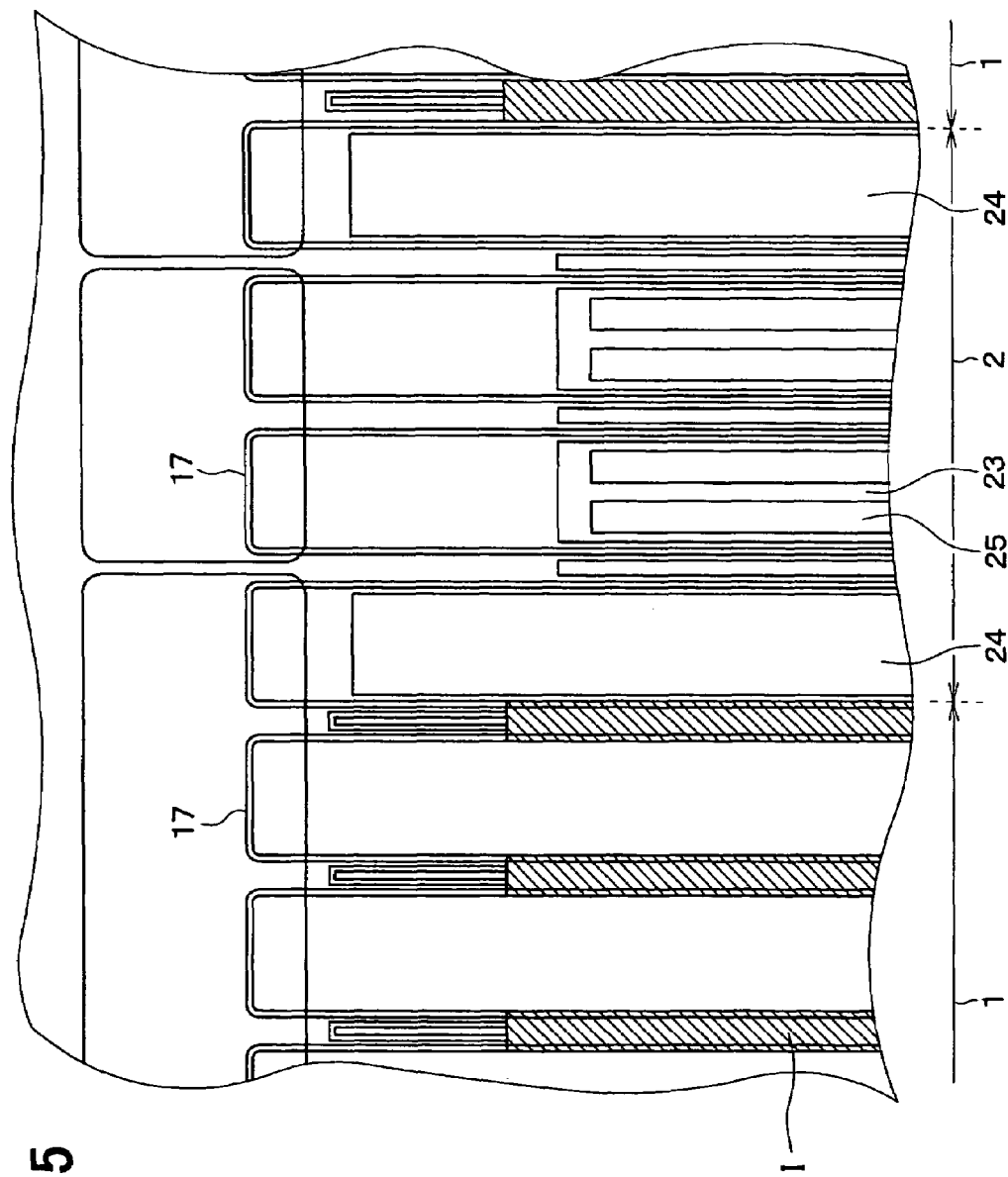
FIG. 5 is a plan view showing a semiconductor device according to a fourth embodiment.

FIG. 5 shows a semiconductor device according to a fourth embodiment. In the diode region 2, the P conductive type region 23, in which the ohmic contact region 25 is formed, reaches the one end of the device region of the IGBT region 1. The one end of the device region is disposed on the periphery along with the direction perpendicular to the repeat direction of the IGBT region 1 and the diode region 2. The Schottky contact region 24 reaches the periphery of the contact portion 22, which is disposed on the periphery along with the direction perpendicular to the repeat direction of the IGBT region 1 and the diode region 2.

When the Schottky contact region 24 for retrieving the holes from the drift layer 11 extends and reaches the periphery of the contact portion 22, the holes are retrieved from around the contact portion 22 by using the Schottky contact region 24 at the diode recovery operation. Thus, the current concentration at the contact portion 22 of the IGBT region 1 is prevented, so that the recovery breakdown property, i.e., the recovery withstand property is improved.

Fifth Embodiment

Figure 6:
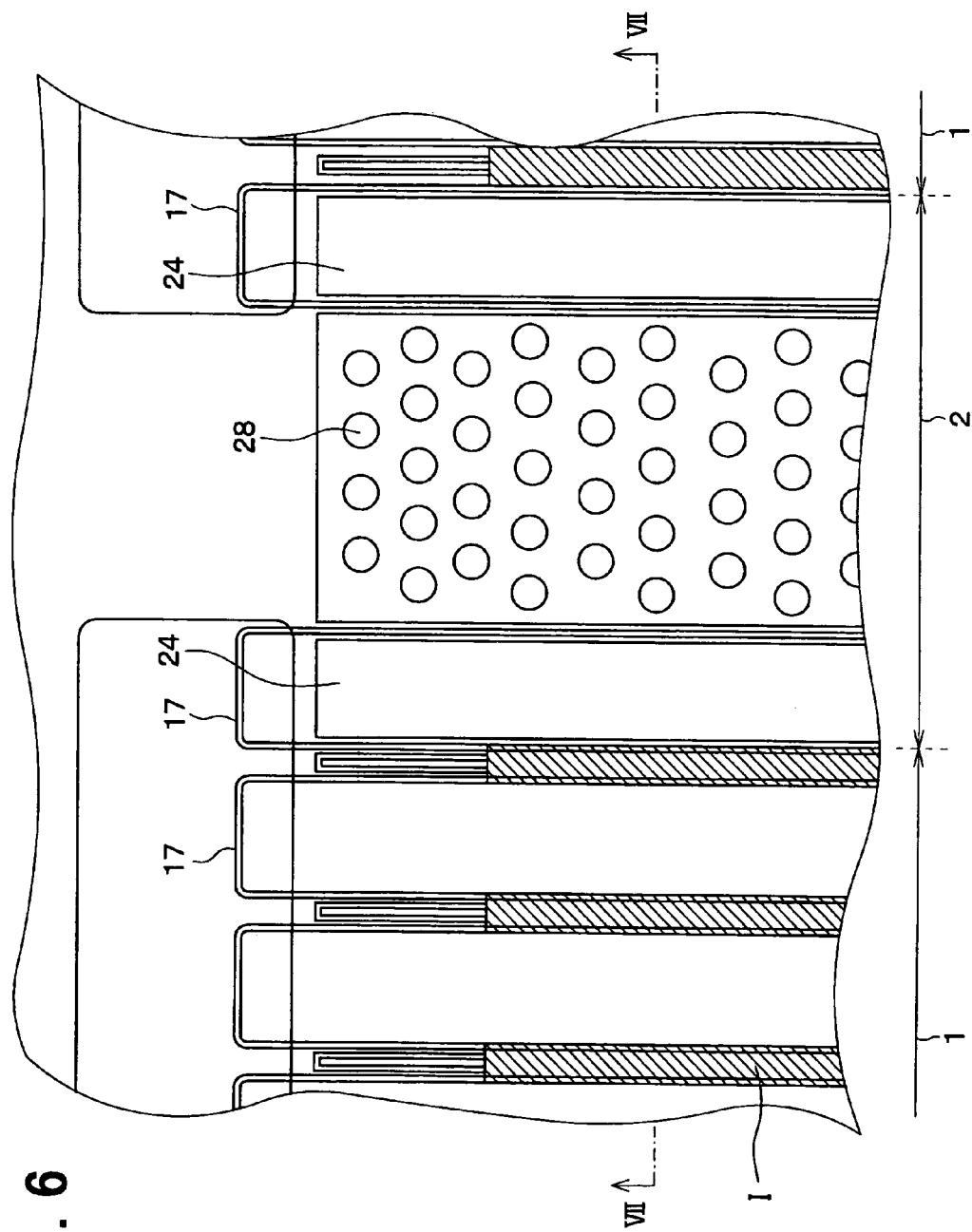
FIG. 6 is a plan view showing a semiconductor device according to a fifth embodiment.
Figure 7:
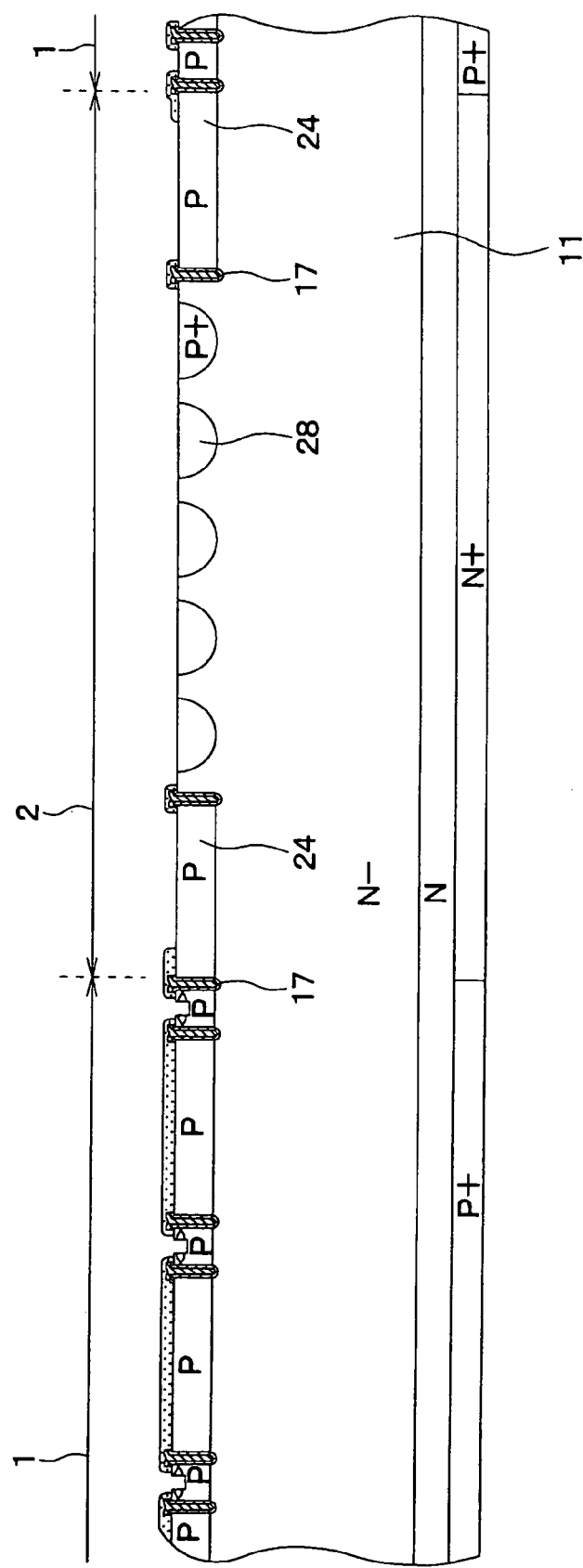
FIG. 7 is a cross sectional view showing the device taken along line VII-VIII in FIG. 6.

FIGS. 6 and 7 show a semiconductor device according to a fifth embodiment.

In this embodiment, the Schottky contact region 24 in the diode region 2 is surrounded with the trench having the rectangular shape. Further, multiple P+ conductive type ohmic contact regions 28 are formed between two adjacent trenches 17 for surrounding the Schottky contact region 24. Specifically, the ohmic contact regions 28 are disposed inside of the diode region 2 from the Schottky contact region 24. Each ohmic contact region 28 has a dot shape, and functions as a supply source of the holes. Thus, the ohmic contact regions 28 are arranged in a dot manner so that multiple dots are arranged in a zigzag manner. Specifically, one dot is surrounded with six dots, which provide a hexagonal shape.

As shown in. FIG. 7, the ohmic contact regions 28 are dotted in the surface portion of the drift layer 11. Another surface portion of the drift layer 11, in which the ohmic contact regions 28 are not formed, functions as the Shottky diode, and the ohmic contact regions 28 functions as the PIN diode. Thus, the PIN diode and the Schottky diode are merged in the diode region 2 so that a MPS (i.e., merged PIN diode and Schottky barrier diode) structure is formed.

Other Embodiments

In the device structure of the IGBT region 1, the body region 15 is formed in the base region 14. Alternatively, the device structure may have a different construction.

The number of stripes of the ohmic contact region 25 surrounded with the trench 17 is two. Alternatively, the number of stripes of the ohmic contact region 25 surrounded with the trench 17 may be one, three or more.

The dot layout of the ohmic contact regions 28 shown in FIG. 6 is an example. Alternatively, the dot layout of the ohmic contact regions 28 may have a different layout.

The above disclosure has the following aspects.

According to a first aspect of the resent disclosure, a semiconductor device includes: a semiconductor substrate including a first conductive type layer; a plurality of IGBT regions, each of which provides an IGBT element; and a plurality of diode regions, each of which provides a diode element. The plurality of IGBT regions and the plurality of diode regions are alternately arranged in the substrate. Each diode region includes a Schottky contact region having a second conductive type. The Schottky contact region is configured to retrieve a minority carrier from the first conductive type layer. The Schottky contact region is disposed in a first surface portion of the first conductive type layer, and adjacent to the IGBT region.

In the above device, since the Schottky contact region is disposed at the boundary between the IGBT region and the diode region, the Schottky contact region retrieves the minority carrier from the first conductive type layer. Thus, the minority carrier at the boundary is reduced, so that a recovery current is prevented from flowing from the diode region to the IGBT region even when the IGBT element turns on in case of recovery process. Accordingly, the current concentration at the boundary in case of diode recovery operation is reduced. Thus, the device is protected from breakdown.

Alternatively, each diode region may further include a trench, which surrounds the Schottky contact region, and the trench has a rectangular shape, penetrates the Shottky contact region and reaches the first conductive type layer. In this case, the device is protected from breakdown. Further, electric field strength is homogeneous, and breakdown voltage of the device is increased.

Alternatively, each diode region may further include a plurality of ohmic contact regions having the second conductive type. The plurality of ohmic contact regions is arranged in a dot matrix. The plurality of ohmic contact regions is disposed in a second surface portion of the first conductive type layer. The plurality of ohmic contact regions is disposed on an inside of the diode region from the Schottky contact region. In this case, a MPS structure is provided.

Alternatively, each diode region may further include a second conductive type region and an ohmic contact region having the second conductive type. The second conductive type region is disposed in a third surface portion of the first conductive type layer. The second conductive type region is disposed on an inside of the diode region from the Schottky contact region. The ohmic contact regions is disposed in a fourth surface portion of the second conductive type region, and the ohmic contact regions has an impurity concentration higher than the second conductive type region. In this case, the ohmic contact region functions as a minority carrier source when the diode element operates in a forward direction, so that the minority carrier is introduced into the first conductive type layer. Thus, the forward voltage of the diode element becomes small, and the forward direction property of the diode is improved. Further, each diode region may further include a trench, which surrounds the second conductive type region, and the trench has a rectangular shape, penetrates the second conductive type region and reaches the first conductive type layer. In this case, the electric field strength is homogenized, and the breakdown voltage of the device is improved. Furthermore, the plurality of IGBT regions and the plurality of diode regions may be alternately arranged in a repeat direction, and the ohmic contact region extends along with a direction perpendicular to the repeat direction so that the ohmic contact region has a stripe pattern. Alternatively, the ohmic contact regions may be disposed in a fifth surface portion of the Schottky contact region, and the ohmic contact region in the Schottky contact region is disposed on an inside of the diode region. In this case, the forward voltage of the diode element becomes much small.

Alternatively, each IGBT region may include: a second conductive type layer disposed in a sixth surface portion of the first conductive type layer; a plurality of trenches surrounding the second conductive type layer, having a rectangular shape, penetrating the second conductive type layer and reaching the first conductive type layer, and arranged along with the repeat direction; a device region disposed between two adjacent trenches, and provided by at least the second conductive type layer; and a contact portion disposed between two adjacent trenches. Each trench extends along with the direction perpendicular to the repeat direction. The contact portion extends along with the direction perpendicular to the repeat direction. The device region extends along with the direction perpendicular to the repeat direction so that the device region has one end and the other end in the direction, and the Schottky contact region and the second conductive type region are disposed between the one end and the other end of the device region. In this case, the recovery current is reduced. Further, the device region may include a groove having a depth shallower than the trench, and wherein the groove is disposed between two adjacent trenches.

Alternatively, each IGBT region may include: a second conductive type layer disposed in a seventh surface portion of the first conductive type layer; a plurality of trenches surrounding the second conductive type layer, having a rectangular shape, penetrating the second conductive type layer and reaching the first conductive type layer, and arranged along with the repeat direction; a device region disposed between two adjacent trenches, and provided by at least the second conductive type layer; and a contact portion disposed between two adjacent trenches. Each trench extends along with the direction perpendicular to the repeat direction. The contact portion extends along with the direction perpendicular to the repeat direction. The contact portion extends along with the direction perpendicular to the repeat direction so that the contact portion has one end and the other end in the direction. The Schottky contact region is disposed between the one end and the other end of the contact portion. The device region extends along with the direction perpendicular to the repeat direction so that the device region has one end and the other end in the direction, and the second conductive type region is disposed between the one end and the other end of the device region. In this case, the current concentration at the contact portion of the IGBT region is reduced. Further, the device region may include a groove having a depth shallower than the trench, and the groove is disposed between two adjacent trenches.

According to a second aspect of the present disclosure, a semiconductor device includes: a semiconductor substrate including a silicon substrate and a first conductive type layer, wherein the first conductive type layer is disposed on the silicon substrate; a plurality of IGBT regions, each of which provides an IGBT element; and a plurality of diode regions, each of which provides a diode element. The plurality of IGBT regions and the plurality of diode regions are alternately arranged in the semiconductor substrate. Each diode region includes a Schottky contact region having a second conductive type. The Schottky contact region is configured to retrieve a minority carrier from the first conductive type layer. The Schottky contact region is disposed in a first surface portion of the first conductive type layer, and adjacent to the IGBT region. Each diode region further includes a second conductive type region and an ohmic contact region having the second conductive type. The second conductive type region is disposed in a third surface portion of the first conductive type layer. The second conductive type region is disposed on an inside of the diode region from the Schottky contact region. The ohmic contact region is disposed in a fourth surface portion of the second conductive type region. The ohmic contact region has an impurity concentration higher than the second conductive type region. Each diode region further includes a trench, which surrounds the second conductive type region and the Schottky contact region, and the trench has a rectangular shape, penetrates the second conductive type region and the Schottky contact region, and reaches the first conductive type layer.

In the above device, since the Schottky contact region is disposed at the boundary between the IGBT region and the diode region, the Schottky contact region retrieves the minority carrier from the first conductive type layer. Thus, the minority carrier at the boundary is reduced, so that a recovery current is prevented from flowing from the diode region to the IGBT region even when the IGBT element turns on in case of recovery process. Accordingly, the current concentration at the boundary in case of diode recovery operation is reduced. Thus, the device is protected from breakdown.

While the invention has been described with reference to preferred embodiments thereof, it is to be understood that the invention is not limited to the preferred embodiments and constructions. The invention is intended to cover various modification and equivalent arrangements. In addition, while the various combinations and configurations, which are preferred, other combinations and configurations, including more, less or only a single element, are also within the spirit and scope of the invention.

What is claimed is:

1. A semiconductor device comprising:
a semiconductor substrate including a first conductive type layer;
a plurality of IGBT regions, each of which provides an IGBT element; and
a plurality of diode regions, each of which provides a diode element, wherein
the plurality of IGBT regions and the plurality of diode regions are alternately arranged in the substrate, wherein
each diode region includes a Schottky contact region having a second conductive type, wherein
the Schottky contact region is configured to retrieve a minority carrier from the first conductive type layer, and wherein the Schottky contact region is disposed in a first surface portion of the first conductive type layer, and adjacent to the IGBT region.

2. The device according to claim 1, wherein
each diode region further includes a trench, which surrounds the Schottky contact region, and wherein
the trench has a rectangular shape, penetrates the Shottky contact region and reaches the first conductive type layer.

3. The device according to claim 1, wherein
each diode region further includes a plurality of ohmic contact regions having the second conductive type, wherein
the plurality of ohmic contact regions is arranged in a dot matrix, wherein
the plurality of ohmic contact regions is disposed in a second surface portion of the first conductive type layer, and wherein
the plurality of ohmic contact regions is disposed on an inside of the diode region from the Schottky contact region.

4. The device according to claim 1, wherein
each diode region further includes a second conductive type region and an ohmic contact region having the second conductive type, wherein
the second conductive type region is disposed in a second surface portion of the first conductive type layer, wherein
the second conductive type region is disposed on an inside of the diode region from the Schottky contact region, wherein
the ohmic contact regions is disposed in a surface portion of the second conductive type region, and wherein
the ohmic contact regions has an impurity concentration higher than the second conductive type region.

5. The device according to claim 4, wherein
each diode region further includes a trench, which surrounds the second conductive type region, and wherein
the trench has a rectangular shape, penetrates the second conductive type region and reaches the first conductive type layer.

6. The device according to claim 5, wherein
the plurality of IGBT regions and the plurality of diode regions are alternately arranged in a repeat direction, and wherein
the ohmic contact region extends along with a direction perpendicular to the repeat direction so that the ohmic contact region has a stripe pattern.

7. The device according to claim 6, wherein
the ohmic contact region is disposed in a surface portion of the Schottky contact region, and wherein
the ohmic contact region is disposed on an inside of the diode region.

8. The device according to claim 6, wherein
each IGBT region includes:
    a second conductive type layer disposed in a third surface portion of the first conductive type layer;
    a plurality of trenches surrounding the second conductive type layer, having a rectangular shape, penetrating the second conductive type layer and reaching the first conductive type layer, and arranged along with the repeat direction;
    a device region disposed between two adjacent trenches, and provided by at least the second conductive type layer; and
    a contact portion disposed between two adjacent trenches, wherein
each trench extends along with the direction perpendicular to the repeat direction, wherein
the contact portion extends along with the direction perpendicular to the repeat direction, wherein
the device region extends along with the direction perpendicular to the repeat direction so that the device region has one end and the other end in the direction, and wherein
the Schottky contact region and the second conductive type region are disposed between the one end and the other end of the device region.

9. The device according to claim 8, wherein
the device region includes a groove having a depth shallower than the trench, and wherein
the groove is disposed between two adjacent trenches.

10. The device according to claim 6, wherein
each IGBT region includes:
    a second conductive type layer disposed in a third surface portion of the first conductive type layer;
    a plurality of trenches surrounding the second conductive type layer, having a rectangular shape, penetrating the second conductive type layer and reaching the first conductive type layer, and arranged along with the repeat direction;
    a device region disposed between two adjacent trenches, and provided by at least the second conductive type layer; and
    a contact portion disposed between two adjacent trenches, wherein
each trench extends along with the direction perpendicular to the repeat direction, wherein
the contact portion extends along with the direction perpendicular to the repeat direction, wherein
the contact portion extends along with the direction perpendicular to the repeat direction so that the contact portion has one end and the other end in the direction, wherein
the Schottky contact region is disposed between the one end and the other end of the contact portion, wherein
the device region extends along with the direction perpendicular to the repeat direction so that the device region has one end and the other end in the direction, and wherein
the second conductive type region is disposed between the one end and the other end of the device region.

11. The device according to claim 10, wherein
the device region includes a groove having a depth shallower than the trench, and wherein
the groove is disposed between two adjacent trenches.

12. A semiconductor device comprising:
a semiconductor substrate including a silicon substrate and a first conductive type layer, wherein the first conductive type layer is disposed on the silicon substrate;
a plurality of IGBT regions, each of which provides an IGBT element; and
a plurality of diode regions, each of which provides a diode element, wherein
    the plurality of IGBT regions and the plurality of diode regions are alternately arranged in the semiconductor substrate, wherein
    each diode region includes a Schottky contact region having a second conductive type, wherein
    the Schottky contact region is configured to retrieve a minority carrier from the first conductive type layer, wherein the Schottky contact region is disposed in a first surface portion of the first conductive type layer, and adjacent to the IGBT region, wherein each diode region further includes a second conductive type region and an ohmic contact region having the second conductive type, wherein the second conductive type region is disposed in a second surface portion of the first conductive type layer, wherein the second conductive type region is disposed on an inside of the diode region from the Schottky contact region, wherein the ohmic contact region is disposed in a surface portion of the second conductive type region, wherein the ohmic contact region has an impurity concentration higher than the second conductive type region, wherein each diode region further includes a trench, which surrounds the second conductive type region and the Schottky contact region, and wherein the trench has a rectangular shape, penetrates the second conductive type region and the Schottky contact region, and reaches the first conductive type layer.

* * * * *